(12) United States Patent
Swiler et al.

(10) Patent No.: US 8,623,744 B1
(45) Date of Patent: Jan. 7, 2014

(54) DIE SINGULATION METHOD

(71) Applicant: Sandia Corporation, Albuquerque, NM (US)

(72) Inventors: Thomas P. Swiler, Albuquerque, NM (US); Ernest J. Garcia, Albuquerque, NM (US); Kathryn M. Francis, Rio Rancho, NM (US)

(73) Assignee: Sandia Corporation, Albuquerque, NM (US)

( * ) Notice: Subject to any disclaimer, the term of this patent is extended or adjusted under 35 U.S.C. 154(b) by 0 days.

(21) Appl. No.: 13/863,509

(22) Filed: Apr. 16, 2013

Related U.S. Application Data

(63) Continuation of application No. 12/758,838, filed on Apr. 13, 2010, now Pat. No. 8,461,023.

(51) Int. Cl.
*H01L 21/301* (2006.01)
*H01L 21/48* (2006.01)
*H01L 21/78* (2006.01)

(52) U.S. Cl.
USPC .......................... 438/464; 438/458; 438/460

(58) Field of Classification Search
USPC .......................................... 438/458, 460, 464
See application file for complete search history.

(56) References Cited

U.S. PATENT DOCUMENTS

| | | | |
|---|---|---|---|
| 6,777,267 B2 * | 8/2004 | Ruby et al. | 438/113 |
| 7,566,634 B2 * | 7/2009 | Beyne et al. | 438/462 |
| 7,781,310 B2 * | 8/2010 | Grivna | 438/462 |
| 2006/0079024 A1 * | 4/2006 | Akram | 438/110 |

* cited by examiner

*Primary Examiner* — Zandra Smith
*Assistant Examiner* — Pamela E Perkins
(74) *Attorney, Agent, or Firm* — Michael A. Beckett

(57) ABSTRACT

A method is disclosed for singulating die from a semiconductor substrate (e.g. a semiconductor-on-insulator substrate or a bulk silicon substrate) containing an oxide layer (e.g. silicon dioxide or a silicate glass) and one or more semiconductor layers (e.g. monocrystalline or polycrystalline silicon) located above the oxide layer. The method etches trenches through the substrate and through each semiconductor layer about the die being singulated, with the trenches being offset from each other around at least a part of the die so that the oxide layer between the trenches holds the substrate and die together. The trenches can be anisotropically etched using a Deep Reactive Ion Etching (DRIE) process. After the trenches are etched, the oxide layer between the trenches can be etched away with an HF etchant to singulate the die. A release fixture can be located near one side of the substrate to receive the singulated die.

22 Claims, 6 Drawing Sheets

DIE SINGULATION METHOD

CROSS REFERENCE TO RELATED APPLICATIONS

This application is a Continuation application of copending utility application U.S. patent application Ser. No. 12/758,838 entitled "DIE SINGULATION METHOD", filed on Apr. 13, 2010, which is incorporated herein by reference in its entirety.

GOVERNMENT RIGHTS

This invention was made with Government support under Contract No. DE-AC04-94AL85000 awarded by the U.S. Department of Energy. The Government has certain rights in the invention.

FIELD OF THE INVENTION

The present invention relates in general to semiconductor processing, and in particular to a method for singulating die from a semiconductor substrate by etching.

BACKGROUND OF THE INVENTION

A large number of semiconductor devices are typically fabricated on a common semiconductor wafer having a diameter up to 12 inches or more and then are separated (i.e. singulated) for packaging as individual devices. These semiconductor devices, which can be integrated circuits (ICs), microprocessors, microelectromechanical systems (MEMS), microfluidic devices, sensors, etc., are conventionally singulated by saw cutting. The use of saw cutting requires a spacing (i.e. a street) between adjacent devices which are being singulated with this spacing being up to 100 microns or more wide; and this spacing limits the number of devices which can be fabricated from the semiconductor wafer. Additionally, saw cutting generates debris which can contaminate the devices or become lodged in moveable members of MEMS devices or in fluid channels of microfluidic devices. Furthermore, saw cutting must be performed along straight lines in a serial fashion one cut at a time; and this limits the shape of the devices to being square or rectangular and generally all of the same size. Saw cutting is also time since each saw cut must be carefully aligned with each street separating adjacent rows of devices to singulate the devices without damaging them. For all of the above reasons, conventional saw cutting is disadvantageous so that an advance in the art is needed to improve the singulation of devices from semiconductor wafers.

The present invention provides such an improvement in the art by providing a method for singulating one or more die from a semiconductor wafer (i.e. a semiconductor substrate) which relies on etching trenches from two opposite sides of the semiconductor wafer with a portion or all of the trench on one side of the semiconductor wafer being laterally offset from the trench on the other side of the semiconductor wafer. The trenches expose an oxide layer on the semiconductor wafer so that when the oxide layer between the trenches is etched away, the die will be singulated. The method can also provide a release fixture beneath the semiconductor wafer to receive and support the singulated die once the oxide layer is etched away between the trenches on each side of the semiconductor wafer.

The method of the present invention is compatible with standard semiconductor processes and allows all of the die on the semiconductor wafer to be singulated simultaneously in a parallel process without attachment to a handle wafer. This saves time and cost and also increases yield and performance by minimizing die handling and particulates which would otherwise occur if conventional sawing were used to singulate the die. This also eliminates adhesives which would otherwise be required to attach the die and the substrate from which the die are formed to the handle wafer, and additional cleaning steps that would be required to remove these adhesives from the singulated die.

The method of the present invention can be used to singulate die of an arbitrary shape, and can be used to form die with rounded corners.

The method of the present invention can be used with silicon-on-insulator (SOI) substrates, or bulk silicon substrates having one or more oxide and polycrystalline silicon layers deposited thereon.

The method of the present invention can also be adapted to release features within one or more MEMS devices which are formed on the die. The offset between the trenches on each side of the substrate can be predetermined so that singulation of the die by etching away the oxide layer between the trenches will occur at a time shortly after release of features within the MEMS devices.

These and other advantages of the present invention will become evident to those skilled in the art.

SUMMARY OF THE INVENTION

The present invention relates to a method for singulating one or more die from a semiconductor substrate having an oxide layer disposed on the semiconductor substrate, and a semiconductor layer disposed on the oxide layer. The method comprises the steps of etching a first trench into one of the semiconductor substrate and the semiconductor layer around the die to be singulated, with the etching of the first trench being terminated proximate to the oxide layer; etching a second trench into the other of the semiconductor substrate and the semiconductor layer, with the etching of the second trench being terminated proximate to the oxide layer, with at least a portion of the second trench being laterally offset from the first trench; and etching away the oxide layer between the first trench and the second trench and thereby singulating the die from the semiconductor substrate.

The semiconductor substrate can comprise monocrystalline silicon, and the semiconductor layer can comprise either monocrystalline silicon (e.g. in the case of a silicon-on-insulator substrate), or polycrystalline silicon (e.g. in the case of a bulk semiconductor substrate). The oxide layer can comprise silicon dioxide or a silicate glass.

In some embodiments of the present invention, one of the steps of etching the first trench and etching the second trench can comprise etching the semiconductor layer to provide lateral dimensions of the semiconductor layer within the die to be singulated which are smaller than the lateral dimensions of the semiconductor substrate in the die. In other embodiments of the present invention, one of the steps of etching the first trench and etching the second trench can comprise etching the semiconductor layer to provide lateral dimensions of the semiconductor layer in the die to be singulated which are larger than the lateral dimensions of the semiconductor substrate in the die.

The step of etching the first trench can comprise etching the first trench using a Deep Reactive Ion Etching (DRIE) process; and the step of etching the second trench can comprise etching the second trench using the DRIE process. The step of etching away the oxide layer between the first trench and the second trench can comprise etching away the oxide layer using an etchant comprising hydrofluoric acid (HF).

The method can further comprise the step of providing a release fixture proximate to the semiconductor substrate during the step of etching away the oxide layer between the first trench and the second trench. The release fixture can include one or more die pockets which are sized to receive the die being singulated. The release fixture can also include one or more openings therethrough, and the step of etching away the oxide layer between the first trench and the second trench can comprise providing an etchant comprising HF (also referred to herein as the HF etchant) in both the first trench and the second trench.

In some embodiments of the present invention wherein the die to be singulated include one or more MEMS devices, one of the steps of etching the first trench and etching the second trench can comprise etching moveable features of each MEMS device located on the die being singulated. In these embodiments, the step of etching away the oxide layer between the first trench and the second trench can also be used to etch away the oxide layer from beneath the moveable features of the MEMS device, thereby releasing the MEMS device. An offset distance between the first trench and the second trench can be sized to be about the same or slightly larger than a widest moveable feature in the MEMS device. When this is done, completion of the step of etching away the oxide layer between the first trench and the second trench can signal completion of releasing the MEMS device. This is advantageous since completion of the step of etching away the oxide layer between the first trench and the second trench can be easily visually observed as the die is singulated and drops away from the substrate.

The present invention also relates to a method for singulating one or more die from a silicon-on-insulator (SOI) substrate having a monocrystalline silicon body, an oxide layer disposed on the monocrystalline silicon body and a monocrystalline silicon layer disposed on the oxide layer. The method comprises the steps of etching a first trench into one of the monocrystalline silicon body and the monocrystalline silicon layer, with the etching of the first trench being terminated proximate to the oxide layer, and with the first trench forming an outline about the die to be singulated from the SOI substrate; etching a second trench into the other of the monocrystalline silicon body and the monocrystalline silicon layer, with the etching of the second trench being terminated proximate to the oxide layer, and with a portion or all of the second trench being laterally offset from the first trench; and etching away the oxide layer between the first trench and the second trench and thereby singulating the die from the SOI substrate.

One of the steps of etching the first trench and etching the second trench can comprise etching the monocrystalline silicon layer in the die to be singulated to provide lateral dimensions which are smaller than the lateral dimensions of the monocrystalline silicon body in the die to be singulated. Alternately, one of the steps of etching the first trench and etching the second trench can comprise etching the monocrystalline silicon layer in the die to be singulated to provide lateral dimensions which are larger than the lateral dimensions of the monocrystalline silicon body in the die to be singulated.

The step of etching the first trench can comprise etching the first trench using a Deep Reactive Ion Etching (DRIE) process. The step of etching the second trench can also comprise etching the second trench using the DRIE process.

The step of etching away the oxide layer between the first trench and the second trench can comprise etching away the oxide layer using an etchant comprising hydrofluoric acid (HF). The method can further comprise the step of removing the die from the HF etchant within a few minutes after singulation of the die by the step of etching away the oxide layer between the first trench and the second trench.

One of the steps of etching the first trench and etching the second trench can comprise etching moveable features of a MEMS device into the monocrystalline silicon layer on the die to be singulated from the SOI substrate. In this case, the step of etching away the oxide layer between the first trench and the second trench can also etch away the oxide layer beneath the moveable features of the MEMS device, thereby releasing the MEMS device for movement. Completion of the step of etching away the oxide layer between the first trench and the second trench can also be used to signal completion of the step of releasing the MEMS device for movement (e.g. when an offset distance between the first trench and the second trench is substantially equal to or slightly larger than the width of a widest moveable feature in the MEMS device).

The method can further comprise the step of providing a release fixture beneath the SOI substrate to support the die after singulating the die by the step of etching away the oxide layer between the first trench and the second trench. The release fixture can include a die pocket located beneath the die to be singulated. The release fixture can also include one or more openings through the release fixture proximate to the die to be singulated. These openings allow the step of etching away the oxide layer to etch away the oxide layer through both the first trench and the second trench.

The present invention further relates to a method for singulating a die from a semiconductor substrate having an oxide layer disposed on the semiconductor substrate, and a semiconductor layer disposed on the oxide layer. The method comprises the steps of anisotropically etching a first trench in the semiconductor substrate around the die to be singulated to expose one side of the oxide layer; anisotropically etching a second trench in the semiconductor layer around the die to be singulated to expose another side of the oxide layer, with the second trench being laterally offset from the first trench around at least a portion of the die to be singulated; providing a release fixture proximate to the semiconductor substrate, with the release fixture having a die pocket to receive the die to be singulated; etching away the oxide layer between the first trench and the second trench and thereby singulating the die from the semiconductor substrate; and catching the singulated die in the die pocket of the release fixture. The substrate can comprise, for example, a silicon-on-insulator (SOI) substrate, or a bulk semiconductor substrate.

The step of anisotropically etching the first trench can comprise anisotropically etching the first trench by a Deep Reactive Ion Etching (DRIE) process; and the step of anisotropically etching the second trench can comprise anisotropically etching the second trench by the DRIE process. The step of etching away the oxide layer can comprise isotropically etching away the oxide layer between the first trench and the second trench using an etchant comprising hydrofluoric acid (HF).

The steps of anisotropically etching the first trench can comprise etching a first annular trench completely around the die to be singulated; and the step of anisotropically etching the second trench can comprise etching a second annular trench completely around the die to be singulated, with the second annular trench being enclosed within an outline about the die which is defined by the annular trench.

Additional advantages and novel features of the invention will become apparent to those skilled in the art upon examination of the following detailed description thereof when considered in conjunction with the accompanying drawings.

The advantages of the invention can be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several aspects of the present invention and, together with the description, serve to explain the principles of the invention. The drawings are only for the purpose of illustrating preferred embodiments of the invention and are not to be construed as limiting the invention. In the drawings.

DETAILED DESCRIPTION OF THE INVENTION

Figure 1:
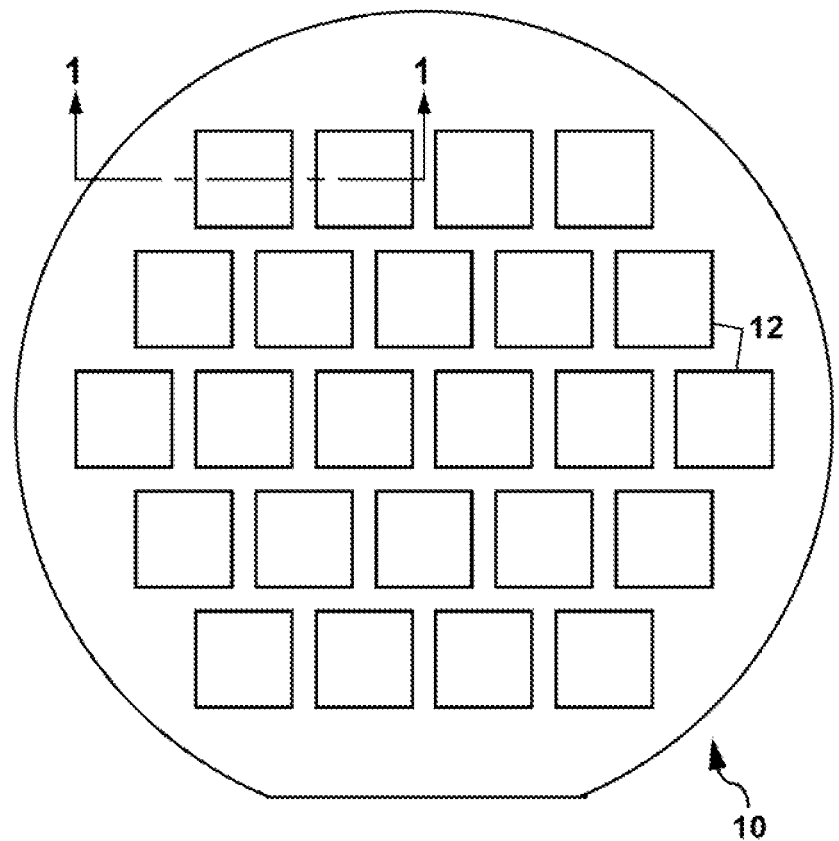
FIG. 1 shows a schematic plan view of a semiconductor substrate having a plurality of die formed thereon prior to singulation of the die using the method of the present invention.
Figure 2:
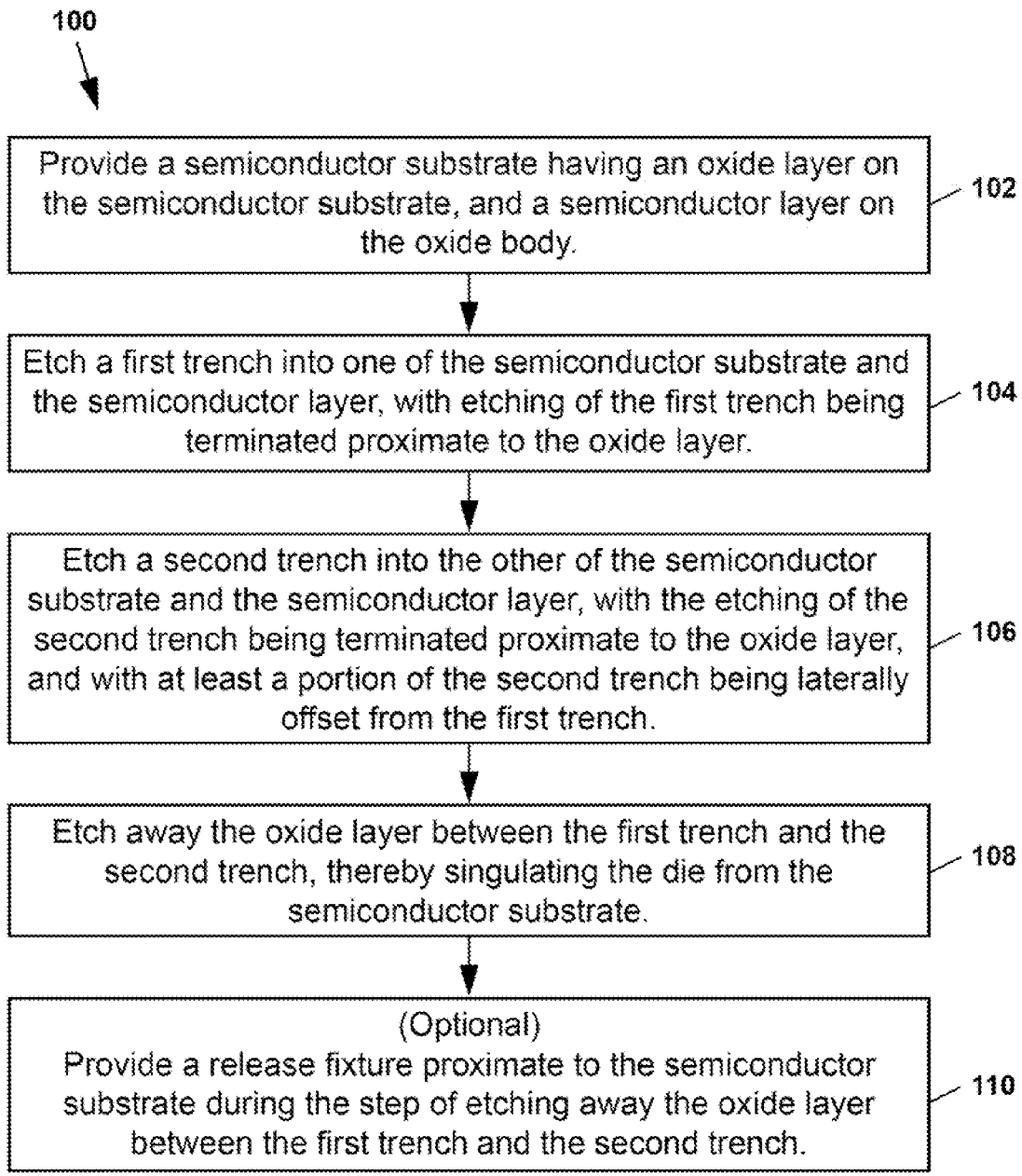
FIG. 2 illustrates steps in the method of the present invention for singulating the die in FIG. 1.

FIG. 1 shows a schematic plan view of a semiconductor substrate 10 having a plurality of die 12 formed thereon prior to singulation of the die 12 according to the method 100 of the present invention. Various steps in the method 100 for singulating the die 12 from the semiconductor substrate 10 are illustrated in FIG. 2 and will be described hereinafter with reference to FIGS. 3A-3E which show a series of schematic partial cross-section views along the section line 1-1 in FIG. 1.

The term "die" as used herein, which can be either singular or plural, refers to a portion of the substrate 10 wherein at least one semiconductor device such as an integrated circuit (IC), a microelectromechanical system (MEMS) device, a microfluidic device, a sensor, or a combination thereof is formed by a series of well-known semiconductor processing steps. The terms "singulation" and "singulating" as used herein refer to separating one or more of the die 12 from the semiconductor substrate 10 wherefrom the die 12 are formed.

Figure 3A:
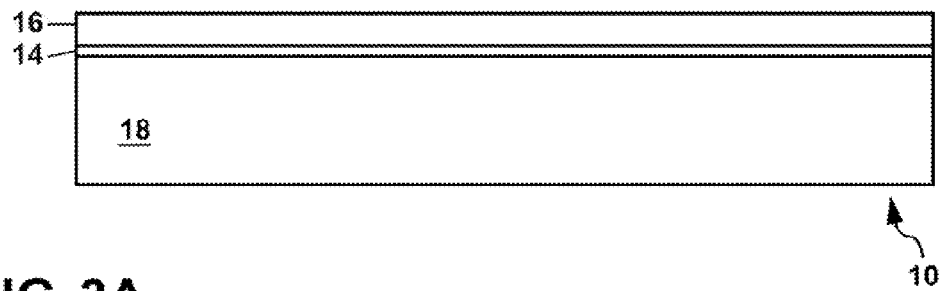
FIGS. 3A-3F show schematic partial cross-section views along the section line 1-1 in FIG. 1 to illustrate the steps in the method of the present invention for singulating the die in FIG. 1.

The method 100 of the present invention can be initiated by a first step 102 wherein a semiconductor substrate 10 is provided on which one or more semiconductor devices have been formed. The semiconductor substrate 10 can comprise an oxide layer 14 disposed on the substrate 10, and one or more semiconductor layers 16 (also termed device layers) located above the oxide layer 14. As an example, the semiconductor substrate 10 can be a silicon-on-insulator (SOI) substrate 10 comprising a monocrystalline silicon base 18 and a monocrystalline silicon layer 16 with the oxide layer 14 (e.g. comprising silicon dioxide) sandwiched therebetween. As another example, the semiconductor substrate 10 can comprise a bulk silicon substrate 18 with an oxide layer 14 (e.g. comprising a silicate glass such as such as TEOS which can be deposited from the thermal decomposition of tetraethylorthosilicate) deposited onto the bulk silicon substrate 18, and with one or more semiconductor layers 16 comprising polycrystalline silicon (also termed polysilicon) deposited above the oxide layer 14. When a plurality of polysilicon layers 16 are used, additional oxide layers 14 can be used to separate adjacent polysilicon layers 16 (e.g. to build up the structure of a MEMS device). FIG. 3A schematically illustrates the semiconductor substrate 10 in a partial cross-section view taken along the section line 1-1 in FIG. 1.

The semiconductor substrate 10 in FIG. 3A can have an overall thickness of, for example, 50-1000 microns (µm). The semiconductor layer 16 can have a thickness, for example, in the range of 1-400 µm depending upon the type of semiconductor devices being formed on the die 12. The oxide layer 14 can have a thickness, for example, of 1-10 µm.

Figure 3B:
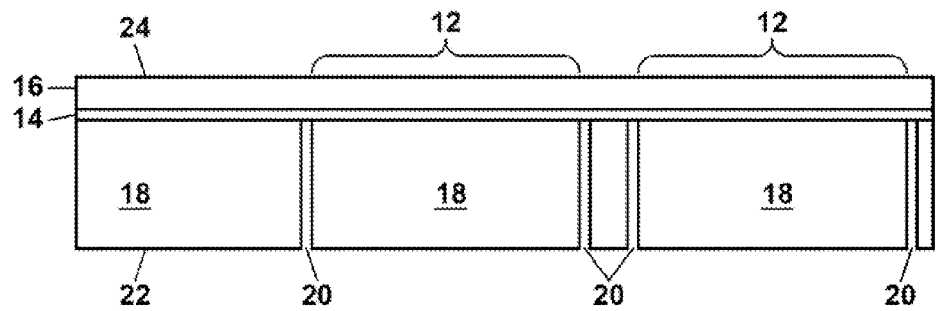

In step 104 in FIG. 2, a first trench 20 can be etched into the semiconductor substrate 10 from a bottom side 22 of the substrate 10. This is schematically illustrated in FIG. 3B. The first trench 20 can be can extend around the die 12 being singulated from the substrate 10 to form an outline about the die 12. The first trench 20 can be an annular trench, or can be a plurality of straight-line, curved or zig-zag trenches which intersect as needed to form the outline around each die 12 and thereby determine the shape for each die 12 being singulated.

The die 12 being singulated according to the method 100 of the present invention can be square, rectangular, polygonal, or any arbitrary shape including a curved shape (e.g. circular or elliptical). When the die 12 being singulated are square or rectangular, the method 100 of the present invention can be used to provide rounded corners on the square or rectangular die 12. This is not possible with conventional saw cutting. Providing rounded corners on die 12 formed according to the method 100 of the present invention can be advantageous since this can reduce the formation of particulates which can otherwise be generated by handling of die with square (i.e. 90°) corners (i.e. the sharp 90° corners can break off during handling of the die to generate the particulates). Such particulates can be damaging to a MEMS device formed on the die since the particulates can eventually become lodged in or between moveable elements of the MEMS device, and render the MEMS device inoperable.

The first trench 20 can be etched through the substrate 10 in step 104 by an anisotropic etching process which produces substantially vertical sidewalls for the first trench 20 which can have a width of, for example, up to 100 µm or more. The anisotropic etching process can comprise a so-called "Bosch process" which is also referred to herein as Deep Reactive Ion Etching (DRIE) and which is disclosed in U.S. Pat. No. 5,501,893 to Laermer et al., which is incorporated herein by reference.

Prior to etching the first trench 20, an etch mask (not shown) can be provided over the bottom side 22 of the substrate 10 with an opening photolithographically defined at the location of the first trench 20 around each die 12 being singulated. The opening in the etch mask can be aligned to alignment features located on a top side 24 of the substrate 10 to precisely locate the first trench 20 about the die 12 being singulated.

Additional openings (not shown) can be photolithographically defined in the etch mask at locations within the die 12 being singulated for etching features to be formed within the die 12. For example, when one or more microfluidic connections are to be provided through the substrate 10 to fluid channels formed on the top side 24 of the substrate 10 within each die 12, each microfluidic connection can be etched during step 104 when the first trench 20 is etched. As another example, when a portion of the substrate 10 (e.g. the monocrystalline silicon base 18 in an SOI substrate 10) is to form a part of a MEMS device (e.g. a proof mass in a MEMS accelerometer), this portion of the substrate 10 can be patterned by etching during the step 104 at the same time the first trench 20 is etched.

With the etch mask in place, the DRIE etch process can be initiated in step 104 to etch the first trench 20 through the substrate 10 from the bottom side 22 thereof as shown in FIG. 3B, with the etching step 104 being terminated proximate to the oxide layer 14. The DRIE etch process uses an iterative plasma deposition and etch cycle wherein a polymer etch inhibitor is conformally deposited as a film over the bottom side 22 of the substrate 10 and in the first trench 20 being etched through the substrate 10 during a deposition cycle, and then the film and a portion of the silicon substrate material in the first trench 20 is then preferentially removed during an etching cycle. The DRIE etch process can have an aspect ratio of up to about 50:1 or more with an etch rate of up to 8 μm per minute or more.

In the DRIE etch process, the polymer film, which can be formed using a plasma containing a fluorocarbon such as $C_4F_8$ and an inert carrier gas such as argon, deposits conformally over a bottom surface and sidewalls of the first trench 20 being etched. During a subsequent etch cycle with a plasma formed from a fluorine-containing gas (e.g. $SF_6$) and the inert carrier gas (e.g. Ar), the polymer film is quickly etched away from the bottom surface of the first trench 20, while the polymer film is etched away more slowly from the sidewalls of the trench 20. This exposes the silicon substrate material at the bottom surface of the first trench 20 to reactive fluorine atoms from the $SF_6$/Ar-based plasma, with the fluorine atoms then being responsible for etching the exposed bottom surface while the sidewalls are protected from being etched by the remaining polymer film. Before the polymer film on the sidewalls of the first trench 20 is completely removed by action of the $SF_6$/Ar-based plasma, the polymer deposition step using the $C_4F_8$/Ar-based plasma is repeated. This cycle is repeated many times, with each polymer deposition and etch cycle generally lasting about 10 seconds or less, until the etching is terminated proximate to the oxide layer 14 (e.g. when the oxide layer 14 is exposed). The oxide layer 14 acts as an etch stop for the DRIE process since the oxide layer 14 is much more resistant to etching by the $C_4F_8$/Ar-based plasma than the silicon substrate material. At the end of this etching step 104, the die 12 being singulated are still attached to the substrate 10 by the oxide layer 14 and the semiconductor layer 16 as shown in FIG. 3B. This maintains the structural integrity of the substrate 10 so that the substrate 10 can be handled.

Figure 3C:
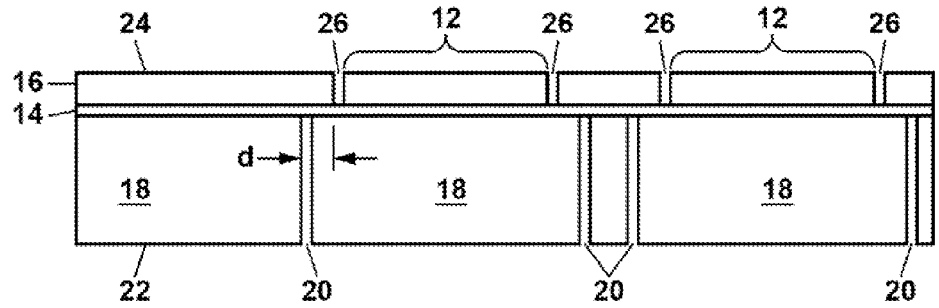

In step 106 in FIG. 2, a second trench 26 can be etched into the semiconductor layer 16 as schematically illustrated in the cross-section view of FIG. 3C. The etching step 106 can be terminated upon etching through the semiconductor layer 16 to expose the underlying oxide layer 14. In preparation for the etching step 106, another etch mask (not shown) can be provided over the top side 24 of the substrate 10 with an opening photolithographically defined at the location of the second trench 26 around each die 12 being singulated. The etching step 106 can then be performed using the same DRIE process described above for etching the first trench 20. Alternately, reactive ion etching (RIE) can be used to etch the second trench 26. The second trench 26 can have a width of, for example, up to 100 μm or more.

According to the method 100 of the present invention, a portion or all of the second trench 26 is laterally offset from the first trench 20 by a distance, d, which can be, for example, 50-100 μm (see FIG. 3C). This maintains the structural integrity of the substrate 10 after the etching steps 104 and 106, with the die 12, which are not yet completely singulated, being held in place on the substrate 10 by a portion of the oxide layer 14 between the first and second trenches 20 and 26. This is advantageous to allow handling of the substrate 10 after completion of the step 106. This also avoids the need for providing any temporary holding material (e.g. epoxy or photoresist) in the first trench 20 after the etching step 104 or in the second trench 26 after the etching step 106 so that the substrate 10 can be handled without breaking, or without the die 12 prematurely falling out of the substrate 10 during handling of the substrate 10. This also avoids the need for temporarily attaching a handle wafer (e.g. a substrate, plate, or tack tape) to one side 22 or 24 of the substrate 10 using an adhesive during singulation of the die 12. The use of an adhesive is disadvantageous since the adhesive can contaminate the die 12 and the semiconductor devices therein, and since additional process steps are required for removing the adhesive and the handle wafer and for cleaning of the die 12 once the adhesive has been removed.

In some embodiments of the present invention, the second trench 26 can be laterally offset from the first trench 20 so that the semiconductor layer 16 in the die 12 being singulated is located completely inside of the outline around the die 12 formed by the first trench 20. This provides lateral dimensions of the semiconductor layer 16 in the die 12 being singulated which are smaller than the lateral dimensions of the substrate 10 and is useful to prevent possible damage to the semiconductor device(s) on the die 12 during handling of the singulated die 12. This is also advantageous to allow the die 12, when completely singulated, to drop through the substrate 10 to an underlying release fixture 28 (see FIGS. 3D-3F) which will be described hereinafter.

In other embodiments of the present invention, the lateral offset between the first trench 20 and the second trench 26 can extend around only a portion of the die 12 being singulated, with the first and second trenches 20 and 26 being superposed one above the other around a remainder of the die 12. In this case, when the semiconductor layer 16 in the die 12 being singulated is inside of the outline formed by the first trench 20, the die 12 upon singulation thereof can drop down through the substrate 10.

In yet other embodiments of the present invention, the second trench 26 can be laterally offset from the first trench 20 so that the semiconductor layer 16 in the die 12 being singulated extends outside of the outline formed by the first trench 20 around a portion or the entirety of the die 12. This is useful to allow the die 12, when completely singulated by removing the oxide layer 14 between the first and second trenches, 20 and 26, to be retained within a frame 34 which is formed by the etching step 108 from a remainder of the substrate 10 not used for the die 12. In this case, the release fixture 28 can be optionally provided on the top side 24 of the substrate 10 (see FIG. 5B).

Those skilled in the art will understand that the order of etching the first trench 20 and the second trench 26 can be reversed from that discussed above (i.e. the order in which the steps 104 and 106 are performed can be reversed, and the locations of the trenches 20 and 26 can be reversed). Thus, the terms "first trench" and "second trench" are not intended to suggest that the "first trench" must always be etched before the "second trench" is etched, or that the "first trench" must always be etched into the substrate 10 with the "second trench" being etched into the semiconductor layer 16. The terms "first trench" and "second trench" as used herein simply indicate that there are two types of trenches 20 and 26 which are etched into opposite sides 22 and 24 of the substrate 10. Thus, according to the present invention, the "first trench" can be etched into one of the semiconductor substrate 10 and the semiconductor layer 16; and the "second trench" can be etched into the other of the semiconductor substrate 10 and the semiconductor layer 16. Furthermore, those skilled in the art will understand that the term "first trench" as used herein can include more than one trench 20, and that the term "second trench" as used herein can include more than one trench 26. This is the case, for example, when there are a plurality of die 12 on the semiconductor substrate 10 and the "first trench" and the "second trench" are formed as isolated annular trenches around each die 12 (i.e. when each die 12 has annular trenches 20 and 26 about that die 12 which do not intersect with the annular trenches 20 and 26 formed about an adjacent die 12).

Figure 3D:
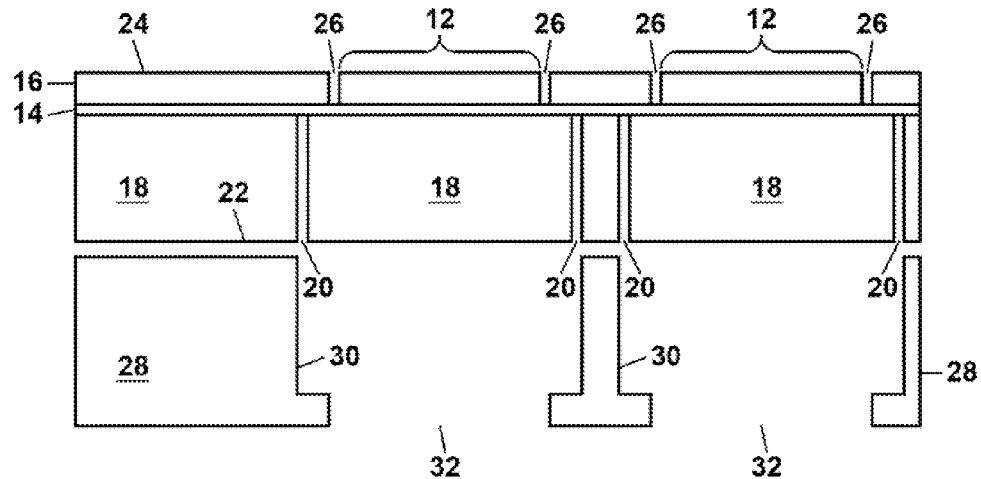

The method 100 of the present invention can include an optional step 110 of providing a release fixture 28 proximate to the semiconductor substrate 10 to receive the die 12 after singulation. FIG. 3D shows an example of the release fixture 28 which can be located beneath the substrate 10 to receive the singulated die 12. In this example, the release fixture 28 includes a die pocket 30 below each die 12 being singulated, with the die pocket 30 being sized to receive the die 12 (e.g. with lateral dimensions parallel to the substrate 10 which are slightly larger than the lateral dimensions of the die 12) so that upon singulation, the die 12 will drop into the die pocket 30 and will be caught and supported therein.

Additionally, the release fixture 28 can include one or more openings 32 through the fixture 28 to provide access for an etchant comprising hydrofluoric acid (HF) to enter the first trench 20. This allows the oxide layer 14 to be etched away from both the first and second trenches 20 and 26 during the etching step 108, thereby reducing the time required for etching away the oxide layer 14 between the first and second trenches 20 and 26. The openings 32 also allow the HF etchant to be drained away from the trench 20 and the die pocket 30 when the etching step 108 is completed.

In other embodiments of the present invention, the release fixture 28 can be a screen, a flat plate, or a wafer (e.g. another silicon substrate) with lateral dimensions about the same as those of the substrate 10, and with one or more openings 32 formed therethrough. When another silicon substrate is used to form the release fixture 28, each die pocket 30 and opening 32 can be etched into the silicon substrate (e.g. by DRIE etching). In some cases, the frame 34 formed from a prior use of the method 100 of the present invention can be used as the release fixture 28 for a subsequent use of the method 100 of the present invention.

According to the present invention, the release fixture 28 is not attached to the semiconductor substrate 10 with an adhesive, but instead is simply located proximate to the substrate 10. It is also not necessary that the release fixture 28 be in contact with the bottom side 22 of the substrate 10 although this can be the case. As long as the release fixture 28 is separated from the bottom side 22 of the substrate 10 by a distance which is less than the thickness of the substrate 10 when arranged as shown in FIG. 3D, the singulated die 12 will be caught and retained between the release fixture 28 and the frame 34 formed from the substrate 10 during the etching step 108. This is the case even if the release fixture 28 and the frame 34 were to be inverted from the position shown in FIG. 3E during the etching step 108, or thereafter. In other embodiments of the present invention, the release fixture 28 can be located proximate to the top side 24 of the substrate 10 or in contact therewith (e.g. when the semiconductor layer 16 of the die 12 being singulated extends outside of the outline formed by the first trench 20 as shown in FIG. 5B).

The semiconductor substrate 10 and the release fixture 28 can be located proximate to each other by inserting them into a wafer carrier (not shown) in preparation for the etching step 108. As mentioned above, the HF etchant is used to remove the oxide layer 14 in the etching step 108. The HF etchant will generally be in the form of a wet solution (e.g. hydrofluoric acid and water, or a buffered oxide etchant comprising hydrofluoric acid, ammonium fluoride and water), although, in some cases, or the HF etchant can be in vapor form. When the oxide layer 14 is etched away between the first and second trenches, 20 and 26, the die 12 will be singulated and will be free to drop into the die pockets 30 in the release fixture 28 when the frame 34 and release fixture 28 are oriented as shown in FIG. 3E.

Figure 3E:
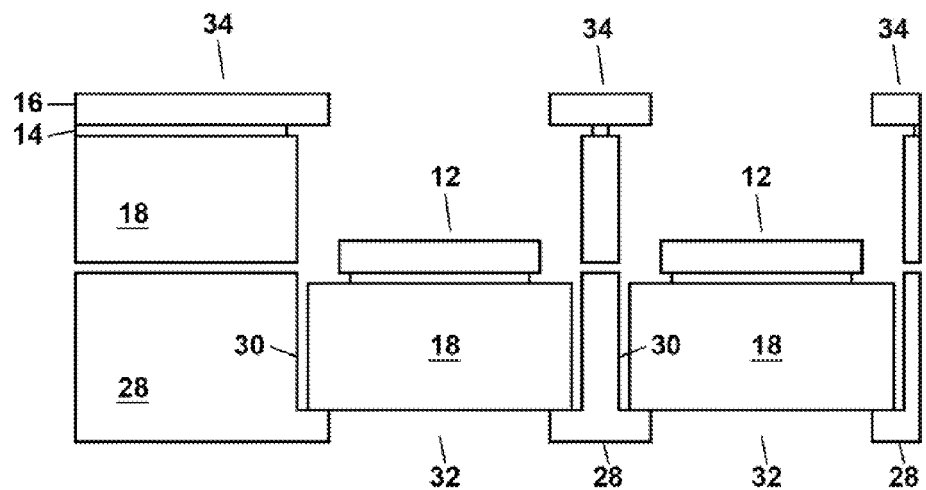

The completion of the etching step 108 can be visually indicated by observing each singulated die 12 as it drops below the top side 24 of the frame 34 formed from the substrate 10 and into an underlying die pocket 30 of the release fixture 28 as shown in FIG. 3E. This visual indication of the die singulation upon completion of the etching step 108 is advantageous since it allows the singulated die 12 to be removed from the HF etchant shortly (e.g. within a few minutes) after singulation, thereby minimizing any etching of the oxide layer 14 beyond that which is necessary to singulate the die 12. This minimizes the etching of the oxide layer 14 which holds the frame 34 together to maintain the integrity of the frame 34 and to allow the frame 34 to be used, if desired, as the release fixture 28 during a subsequent use of the method 100 to singulate additional die 12 from another semiconductor substrate 10. This also minimizes the etching of the oxide layer 14 which holds the semiconductor layer 16 in place in each singulated die 12.

Figure 4A:
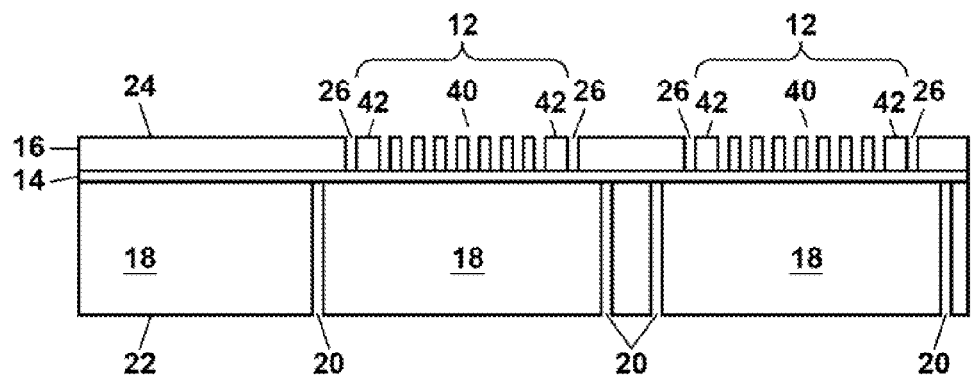
FIG. 4A shows a schematic partial cross-section view similar to FIG. 3C but with a MEMS device being formed on each die to illustrate how an offset distance between the trenches can be predetermined so that the MEMS device is released prior to or at about the same time the die is singulated by the method of the present invention.
Figure 4B:
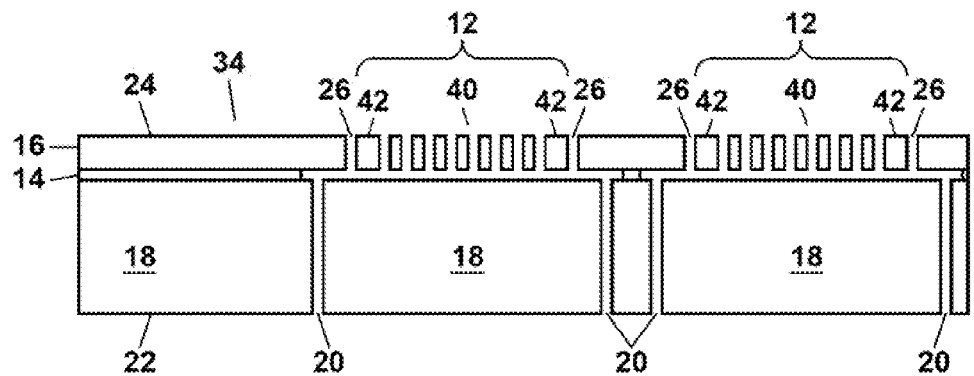
FIG. 4B shows a schematic partial cross-section view of the semiconductor substrate of FIG. 4A after singulating the die according to the method of the present invention, with the MEMS device being fully released for movement.

When a MEMS device 40 is formed in the semiconductor layer 16, the offset distance, d, between the first and second trenches, 20 and 26 (see FIG. 3C), can be predetermined so that the MEMS device 40 will be released at about the same time or prior to the singulation of the die 12 by the etching step 108. The MEMS device 40 can include a plurality of moveable features to be released including a widest moveable feature 42 as schematically illustrated in FIG. 4A which schematically illustrates the substrate 10 and die 12 prior to the etching step 108. These moveable features of the MEMS device 40 can be etched into the semiconductor layer 16 during the step 106 for etching the second trench 26. By making the offset distance, d, about the same or slightly larger than the width of the widest moveable feature 42 of the MEMS device 40, the oxide layer 14 beneath the widest moveable feature 42 can be removed by the HF etchant at about the same time or prior to the oxide layer 14 being etched away between the trenches 20 and 26 by the etching step 108 to singulate the die 12. The singulated die 12 and the released MEMS device 40 thereon are shown in FIG. 4B after completion of the etching step 108. Portions of the oxide layer 14 can be retained, as needed, to anchor the moveable features of the MEMS device to the underlying monocrystalline silicon base or bulk silicon substrate 18 and also to anchor the semiconductor layer 16 to the substrate 18 in the frame 34. This can be done, for example, by encapsulating these portions of the oxide layer 14 (e.g. in a deposited layer of polysilicon or silicon nitride) so that they are not exposed to the HF etchant, or by providing one or more supports for the moveable features of the MEMS device 40 which are wider than the widest moveable features 42 therein so that the oxide layer 14 will not be completely removed beneath the supports during the etching step 108.

The terms "release," "released" and "releasing" used herein refer to well-known terms of art which describe a process of removing a sacrificial material (e.g. by etching away an exposed portion of one or more oxide layers 14) after build-up of the structure of a MEMS device or a microfluidic device to free up moveable elements in the MEMS device or to open up fluid channels in the microfluidic device so that these devices can operate for their intended purpose (i.e. so that the moveable elements in the MEMS device can move in response to applied forces, or so that a fluid can be conducted through the fluid channels in the microfluidic device).

Releasing the MEMS device 40 on each die 12 prior to or at the same time the die 12 are singulated using the step 108 is advantageous singulation of the die 12 can be easily observed visually due to the relatively large size of the die 12; whereas releasing the MEMS device 40 is not so easy to visually observe since the widest moveable features 42 of the MEMS device 40 will be much smaller. Thus, visually observing the completion of singulating the die 12 by the etching step 108 provides a convenient indicator of the completion of releasing the MEMS device 40 on the die 12, and can be used to avoid the need for a precise timing of the etching step 108 and can also be used to avoid over etching of the oxide layer 14 beneath the MEMS device 40.

The use of the release fixture 28 in step 110 as discussed previously is also advantageous since it prevents the singulated die 12 from dropping down to the bottom of a tank or chamber containing the HF etchant during the etching step 108, and instead allows the singulated die 12 to be easily removed all at once from the HF etchant while minimizing any potential damage to the singulated die 12 from handling. The use of the release fixture 28 can also hold the singulated die 12 in place during additional processing (e.g. when the HF etchant is rinsed off of the singulated die 12, and when the die 12 are dried).

Figure 3F:
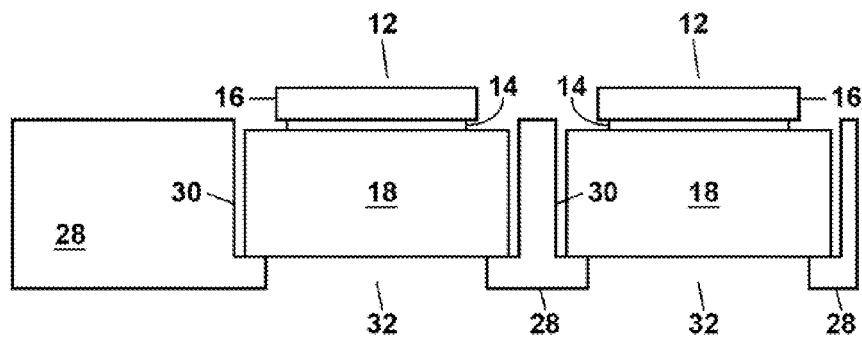

After the etching step 108, the frame 34 formed from the remainder of the substrate 10 which is not used for the die 12 can be removed to leave the singulated die 12 in place in the release fixture 28 as shown in FIG. 3F. The singulated die 12 can be individually removed by hand (e.g. with tweezers or a vacuum wand) or using a conventional pick-and-place apparatus. The singulated die 12 can then be placed into a container (e.g. a Gel Pack container), or in a permanent package.

Figure 5A:
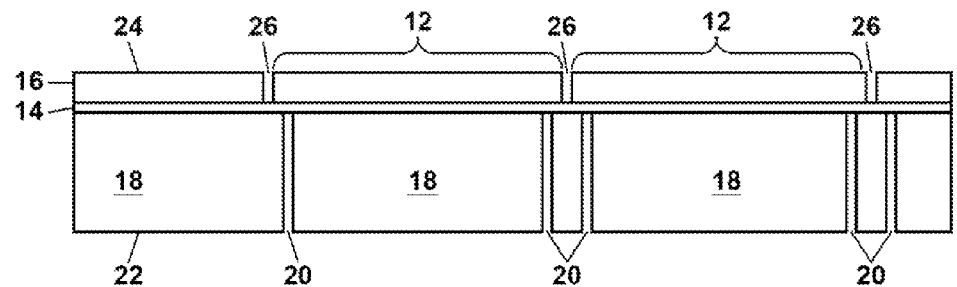
FIG. 5A shows a schematic partial cross-section view similar to FIG. 3C but with the second trench being laterally offset from the first trench so that the semiconductor layer within each die being singulated extends outside of an outline around the die formed by the first trench.
Figure 5B:
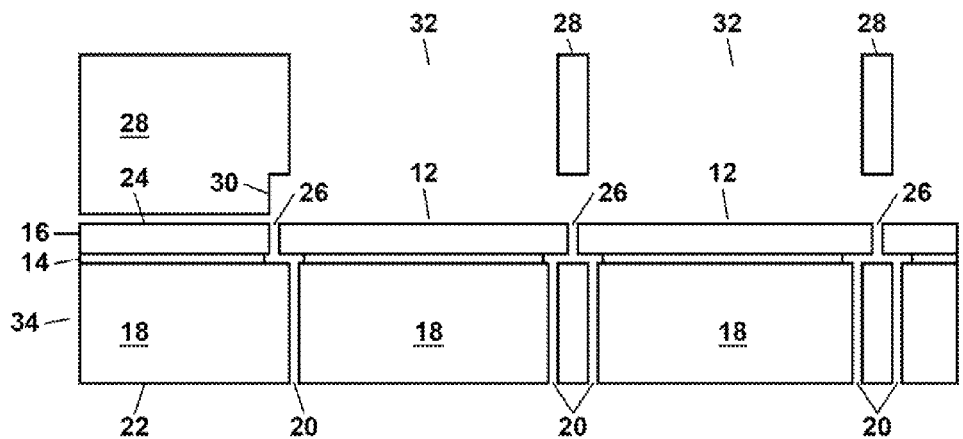
FIG. 5B shows a schematic partial cross-section view of the semiconductor substrate of FIG. 5A after singulation of the die, with a release fixture being located proximate to the semiconductor substrate.

FIG. 5A shows a partial schematic cross-section view similar to FIG. 3C, but with the second trench 26 being laterally offset from the first trench 20 so that the semiconductor layer 16 in the die 12 being singulated extends outside of the outline around the die 12 formed by the first trench 20. In this case, when the oxide layer 14 is etched away between the first and second trenches 20 and 26 by the etching step 108, the singulated die 12 can be supported by the frame 34 formed from the remainder of the substrate 10 when the frame 34 and die 12 are oriented upright as shown in FIG. 5B.

Prior to the etching step 108, a release fixture 28 can be optionally provided over the substrate 10 as shown in FIG. 5B. This is useful to hold the die 12 in place at any arbitrary angle during and after the etching step 108. The release fixture 28 can optionally include one or more die pockets 30 as shown in FIG. 5B, with the die pockets 30 having lateral dimensions which are slightly larger than the die 12 being singulated. One or more openings 32 can also be provided in the release fixture 28 as shown in FIG. 5B to provide access for the HF etchant to reach the oxide layer 14 through the second trench 26 about each die 12. The release fixture 28 can be fabricated, for example, by etching a silicon substrate or, in some cases, can comprise a frame 34 from a prior etching step 108.

The matter set forth in the foregoing description and accompanying drawings is offered by way of illustration only and not as a limitation. The actual scope of the invention is intended to be defined in the following claims when viewed in their proper perspective based on the prior art.

What is claimed is:

1. A method for singulating a die from a semiconductor substrate having an oxide layer disposed on the semiconductor substrate and a semiconductor layer disposed on the oxide layer, the method comprising the steps of:
    etching a first trench into one of the semiconductor substrate and the semiconductor layer around the die to be singulated, with the etching of the first trench being terminated proximate to the oxide layer;
    etching a second trench into the other of the semiconductor substrate and the semiconductor layer around the die to be singulated, with the etching of the second trench being terminated proximate to the oxide layer, and with at least a portion of the second trench being laterally offset from the first trench;
    etching away the oxide layer between the first trench and the second trench and thereby singulating the die from the semiconductor substrate; and
    providing a release fixture proximate to the semiconductor substrate during the step of etching away the oxide layer between the first trench and the second trench.

2. The method of claim 1 wherein the semiconductor substrate comprises monocrystalline silicon, and the semiconductor layer comprises monocrystalline silicon or polycrystalline silicon.

3. The method of claim 1 wherein the oxide layer comprises silicon dioxide or a silicate glass.

4. The method of claim 1 wherein the semiconductor substrate comprises a silicon-on-insulator (SOI) substrate.

5. The method of claim 1 wherein one of the steps of etching the first trench and etching the second trench comprises etching the semiconductor layer to provide lateral dimensions of the semiconductor layer in the die to be singulated which are smaller than the lateral dimensions of the semiconductor substrate in the die.

6. The method of claim 1 wherein one of the steps of etching the first trench and etching the second trench comprises etching the semiconductor layer to provide lateral dimensions of the semiconductor layer in the die to be singulated which are larger than the lateral dimensions of the semiconductor substrate in the die.

7. The method of claim 1 wherein the step of etching the first trench comprises etching the first trench using a Deep Reactive Ion Etching (DRIE) process, and the step of etching the second trench comprises etching the second trench using the DRIE process.

8. The method of claim 7 wherein the step of etching away the oxide layer between the first trench and the second trench comprises etching away the oxide layer using an etchant comprising hydrofluoric acid (HF).

9. The method of claim 1 wherein the release fixture includes at least one opening therethrough, and the step of etching away the oxide layer between the first trench and the second trench comprises providing an etchant comprising hydrofluoric acid (HF) in both the first trench and the second trench.

10. The method of claim 1 wherein one of the steps of etching the first trench and etching the second trench comprises etching moveable features of a microelectromechanical system (MEMS) device located on the die to be singulated.

11. The method of claim 10 wherein the step of etching away the oxide layer between the first trench and the second trench also etches away the oxide layer beneath the moveable features of the MEMS device, thereby releasing the MEMS device.

12. The method of claim 11 wherein completion of the step of etching away the oxide layer between the first trench and the second trench signals completion of releasing the MEMS device.

13. A method for singulating a die from a silicon-on-insulator (SOI) substrate having a monocrystalline silicon body, an oxide layer disposed on the monocrystalline silicon body and a monocrystalline silicon layer disposed on the oxide layer, the method comprising the steps of:
  etching a first trench into one of the monocrystalline silicon body and the monocrystalline silicon layer, with the etching of the first trench being terminated proximate to the oxide layer, and with the first trench forming an outline about the die to be singulated from the SOI substrate;
  etching a second trench into the other of the monocrystalline silicon body and the monocrystalline silicon layer, with the etching of the second trench being terminated proximate to the oxide layer, and with at least a portion of the second trench being laterally offset from the first trench;
  etching away the oxide layer between the first trench and the second trench and thereby singulating the die from the SOI substrate; and
  providing a release fixture beneath the SOI substrate to support the die after singulating the die by the step of etching away the oxide layer between the first trench and the second trench.

14. The method of claim 13 wherein one of the steps of etching the first trench and etching the second trench comprises etching the monocrystalline silicon layer in the die to be singulated to provide lateral dimensions which are smaller than the lateral dimensions of the monocrystalline silicon body in the die to be singulated.

15. The method of claim 13 wherein one of the steps of etching the first trench and etching the second trench comprises etching the monocrystalline silicon layer in the die to be singulated to provide lateral dimensions which are larger than the lateral dimensions of the monocrystalline silicon body in the die to be singulated.

16. The method of claim 13 wherein the step of etching the first trench comprises etching the first trench using a Deep Reactive Ion Etching (DRIE) process, and the step of etching the second trench comprises etching the second trench using the DRIE process.

17. The method of claim 16 wherein the step of etching away the oxide layer between the first trench and the second trench comprises etching away the oxide layer using an etchant comprising hydrofluoric acid (HF).

18. The method of claim 17 further comprising the step of removing the die from the HF etchant within a few minutes after singulation of the die by the step of etching away the oxide layer between the first trench and the second trench.

19. The method of claim 13 wherein one of the steps of etching the first trench and etching the second trench comprises etching moveable features of a microelectromechanical system (MEMS) device into the monocrystalline silicon layer on the die to be singulated from the SOI substrate.

20. The method of claim 19 wherein the step of etching away the oxide layer between the first trench and the second trench also etches away the oxide layer beneath the moveable features of the MEMS device, thereby releasing the MEMS device for movement.

21. The method of claim 20 wherein completion of the step of etching away the oxide layer between the first trench and the second trench signals completion of releasing the MEMS device for movement.

22. The method of claim 13 wherein the release fixture includes an opening therethrough proximate to the die to be singulated, and the step of etching away the oxide layer comprises etching away the oxide layer through both the first trench and the second trench.

* * * * *